United States Patent
Lee

(10) Patent No.: US 9,841,443 B2
(45) Date of Patent: Dec. 12, 2017

(54) DETECTION CIRCUIT

(71) Applicant: VIA Alliance Semiconductor Co., Ltd., Shanghai (CN)

(72) Inventor: Yeong-Sheng Lee, Fremont, CA (US)

(73) Assignee: VIA ALLIANCE SEMICONDUCTOR CO., LTD., Shanghai (CN)

( * ) Notice: Subject to any disclaimer, the term of this patent is extended or adjusted under 35 U.S.C. 154(b) by 385 days.

(21) Appl. No.: 14/695,629

(22) Filed: Apr. 24, 2015

(65) Prior Publication Data
US 2016/0313376 A1    Oct. 27, 2016

(51) Int. Cl.
*G01R 27/08* (2006.01)
*G01R 19/00* (2006.01)
*G01R 27/02* (2006.01)

(52) U.S. Cl.
CPC ......... *G01R 19/0038* (2013.01); *G01R 27/02* (2013.01)

(58) Field of Classification Search
CPC ..... G01R 19/0038; G01R 27/02; G01R 27/14
USPC ........................................................ 324/705
See application file for complete search history.

(56) References Cited

U.S. PATENT DOCUMENTS

| | | | | |
|---|---|---|---|---|
| 3,503,261 A * | 3/1970 | Kobayashi | ................ | G01P 1/10 323/909 |
| 4,143,550 A * | 3/1979 | Kobayashi | ................ | G01K 7/20 323/366 |
| 5,446,397 A * | 8/1995 | Yotsuyanagi | ........ | H03K 5/2472 323/315 |
| 6,161,027 A * | 12/2000 | Poirel | ................... | H04W 88/02 455/127.1 |
| 2003/0176856 A1* | 9/2003 | Howell | ................. | A61B 18/08 606/29 |
| 2009/0009187 A1* | 1/2009 | Kwak | ................. | G06F 13/4081 324/630 |
| 2009/0251156 A1* | 10/2009 | Jasa | ....................... | G01R 27/14 324/704 |
| 2014/0139281 A1* | 5/2014 | Maher | ..................... | H03K 5/08 327/309 |
| 2014/0354308 A1* | 12/2014 | Hong | ....................... | G01K 7/22 324/713 |

FOREIGN PATENT DOCUMENTS

| | | |
|---|---|---|
| CN | 1834840 A | 9/2006 |
| CN | 102047129 A | 5/2011 |
| CN | 104215353 A | 12/2014 |

* cited by examiner

*Primary Examiner* — Daniel Miller
(74) *Attorney, Agent, or Firm* — McClure, Qualey & Rodack, LLP

(57) ABSTRACT

A detection circuit for detecting an external device with a specific resistance is provided. The detection circuit includes a first resistor, a second resistor, a first converter, a second converter, a device converter, a first current comparator, and a second current comparator. The first resistor has a first resistance. The second resistor has a second resistance. The first converter is configured to convert the first resistance into a first current. The second converter is configured to convert the second resistance into a second current. The device converter is configured to convert the specific resistance into a specific current. The first current comparator is configured to compare the specific current with the first current, and generate a first output signal. The second current comparator is configured to compare the specific current with the second current, and generate a second output signal.

13 Claims, 7 Drawing Sheets

DETECTION CIRCUIT

BACKGROUND OF THE INVENTION

Field of the Invention

The disclosure generally relates to a detection circuit, and more specifically, to a detection circuit for precisely detecting resistance of an external device.

Description of the Related Art

In the field of mobile devices, detection circuits are commonly configured to determine the type of any external device connected thereto. Conventional detection circuits generally include transistors used as switches for controlling the detection procedure. However, since these switches are not ideal and have small resistances, they often result in detection errors and degrade the performance of detection circuits. The resistance of transistors may be almost eliminated by significantly increasing the size of the transistors, but this solution cannot be applied to small mobile devices. As a result, there is a need to design a novel detection circuit so as to overcome the drawbacks of the prior art.

BRIEF SUMMARY OF THE INVENTION

In a preferred embodiment, the invention is directed to a detection circuit for detecting an external device with a specific resistance, including: a first resistor, having a first resistance; a second resistor, having a second resistance; a first converter, converting the first resistance into a first current; a second converter, converting the second resistance into a second current; a device converter, converting the specific resistance into a specific current; a first current comparator, comparing the specific current with the first current, and generating a first output signal; and a second current comparator, comparing the specific current with the second current, and generating a second output signal, wherein the specific resistance is determined according to the first output signal and the second output signal.

In some embodiments, each of the device converter, the first converter, and the second converter includes: a first transistor, wherein the first transistor has a control terminal, a first terminal coupled to a supply voltage, and a second terminal; a second transistor, wherein the second transistor has a control terminal, a first terminal coupled to the second terminal of the first transistor, and a second terminal coupled to a corresponding one of the external device, the first resistor, and the second resistor; a third transistor, wherein the third transistor has a control terminal coupled to the control terminal of the first transistor, a first terminal coupled to the supply voltage, and a second terminal; and a fourth transistor, wherein the fourth transistor has a control terminal coupled to the control terminal of the second transistor, a first terminal coupled to the second terminal of the third transistor, and a second terminal coupled to the control terminal for outputting a corresponding one of the specific current, the first current, and the second current.

In some embodiments, the detection circuit further includes a power-saving circuit, generating a control signal for selectively enabling and disabling the device converter, the first converter, and the second converter.

In some embodiments, the device converter, the first converter, and the second converter are enabled periodically and disabled after the first output signal and the second output signal are generated.

In some embodiments, each of the device converter, the first converter, and the second converter further includes: a fifth transistor, wherein the fifth transistor has a control terminal for receiving the control signal, a first terminal coupled to the supply voltage, and a second terminal coupled to the control terminal of the first transistor; and a sixth transistor, wherein the sixth transistor has a control terminal for receiving the control signal, a first terminal coupled to the second terminal of the first transistor, and a second terminal coupled to the control terminal of the first transistor.

In some embodiments, each of the first current comparator and the second current comparator includes: a seventh transistor, wherein the seventh transistor has a control terminal, a first terminal coupled to a ground voltage, and a second terminal; an eighth transistor, wherein the eighth transistor has a control terminal, a first terminal coupled to the ground voltage, and a second terminal; a ninth transistor, wherein the ninth transistor has a control terminal coupled to the second terminal of the eighth transistor, a first terminal coupled to a supply voltage, and a second terminal coupled to the second terminal of the seventh transistor; a tenth transistor, wherein the tenth transistor has a control terminal coupled to the second terminal of the seventh transistor, a first terminal coupled to the supply voltage, and a second terminal coupled to the second terminal of the eighth transistor; a first inverter, wherein the first inverter has an input terminal coupled to the second terminal of the seventh transistor, and an output terminal; a first comparing branch, coupled between the ground voltage and the control terminal of the seventh transistor, and conducting a current mirrored from the specific current; a second comparing branch, coupled between the supply voltage and the control terminal of the seventh transistor, and conducting a current mirrored from a corresponding one of the first current and the second current; a third comparing branch, coupled between the ground voltage and the control terminal of the eighth transistor, and conducting a current mirrored from a corresponding one of the first current and the second current; and a fourth comparing branch, coupled between the supply voltage and the control terminal of the eighth transistor, and conducting a current mirrored from the specific current, wherein the output terminal of the first inverter outputs a corresponding one of the first output signal and the second output signal.

In some embodiments, each of the first current comparator and the second current comparator further includes: a first sink-to-source branch, coupled between the supply voltage and the ground voltage, and mirroring the specific current to the first comparing branch and the fourth comparing branch; and a second sink-to-source branch, coupled between the supply voltage and the ground voltage, and mirroring a corresponding one of the first current and the second current to the second comparing branch and the third comparing branch.

In some embodiments, each of the first current comparator and the second current comparator further includes: a first input branch, receiving the specific current and mirroring the specific current to the first sink-to-source branch; and a second input branch, receiving a corresponding one of the first current and the second current and mirroring a corresponding one of the first current and the second current to the second sink-to-source branch.

In some embodiments, the first comparing branch includes: a seventeenth transistor, wherein the seventeenth transistor has a control terminal, a first terminal, and a second terminal coupled to the control terminal of the seventh transistor; and an eighteenth transistor, wherein the eighteenth transistor has a control terminal, a first terminal coupled to the ground voltage, and a second terminal coupled to the first terminal of the seventeenth transistor, and wherein the fourth comparing branch includes: a twenty-ninth transistor, wherein the twenty-ninth transistor has a control terminal, a first terminal coupled to the supply voltage, and a second terminal coupled to the control terminal; and a thirtieth transistor, wherein the thirtieth transistor has a control terminal, a first terminal coupled to the control terminal of the twenty-ninth transistor, and a second terminal coupled to the control terminal of the eighth transistor.

In some embodiments, the first sink-to-source branch includes: a thirteenth transistor, wherein the thirteenth transistor has a control terminal coupled to the control terminal of the twenty-ninth transistor, a first terminal coupled to the supply voltage, and a second terminal; a fourteenth transistor, wherein the fourteenth transistor has a control terminal coupled to the control terminal of the thirtieth transistor, a first terminal coupled to the second terminal of the thirteenth transistor, and a second terminal coupled to the control terminal of the thirtieth transistor; a fifteenth transistor, wherein the fifteenth transistor has a control terminal coupled to the control terminal of the seventeenth transistor, a first terminal, and a second terminal coupled to the control terminal of the thirtieth transistor; and a sixteenth transistor, wherein the sixteenth transistor has a control terminal coupled to the control terminal of the eighteenth transistor, a first terminal coupled to the ground voltage, and a second terminal coupled to the control terminal.

In some embodiments, the first input branch includes: an eleventh transistor, wherein the eleventh transistor has a control terminal coupled to the control terminal of the fifteenth transistor, a first terminal, and a second terminal coupled to the control terminal; and a twelfth transistor, wherein the twelfth transistor has a control terminal coupled to the control terminal of the sixteenth transistor, a first terminal coupled to the ground voltage, and a second terminal coupled to the first terminal of the eleventh transistor, wherein the second terminal of the eleventh transistor receives the specific current.

In some embodiments, the second comparing branch includes: a nineteenth transistor, wherein the nineteenth transistor has a control terminal, a first terminal coupled to the supply voltage, and a second terminal coupled to the control terminal; and a twentieth transistor, wherein the twentieth transistor has a control terminal, a first terminal coupled to the second terminal of the nineteenth transistor, and a second terminal coupled to the control terminal of the seventh transistor, and wherein the third comparing branch includes: a twenty-seventh transistor, wherein the twenty-seventh transistor has a control terminal, a first terminal, and a second terminal coupled to the control terminal of the eighth transistor; and an twenty-eighth transistor, wherein the twenty-eighth transistor has a control terminal, a first terminal coupled to the ground voltage, and a second terminal coupled to the first terminal of the twenty-seventh transistor.

In some embodiments, the second sink-to-source branch includes: a twenty-third transistor, wherein the twenty-third transistor has a control terminal coupled to the control terminal of the nineteenth transistor, a first terminal coupled to the supply voltage, and a second terminal; a twenty-fourth transistor, wherein the twenty-fourth transistor has a control terminal coupled to the control terminal of the twentieth transistor, a first terminal coupled to the second terminal of the twenty-third transistor, and a second terminal coupled to the control terminal; a twenty-fifth transistor, wherein the twenty-fifth transistor has a control terminal coupled to the control terminal of the twenty-seventh transistor, a first terminal, and a second terminal coupled to the second terminal of the twenty-fourth transistor; and a twenty-sixth transistor, wherein the twenty-sixth transistor has a control terminal coupled to the control terminal of the twenty-eighth transistor, a first terminal coupled to the ground voltage, and a second terminal coupled to the control terminal.

In some embodiments, the second input branch includes: a twenty-first transistor, wherein the twenty-first transistor has a control terminal coupled to the control terminal of the twenty-fifth transistor, a first terminal, and a second terminal coupled to the control terminal; and a twenty-second transistor, wherein the twenty-second transistor has a control terminal coupled to the control terminal of the twenty-sixth transistor, a first terminal coupled to the ground voltage, and a second terminal coupled to the first terminal of the twenty-first transistor, wherein the second terminal of the twenty-first transistor receives a corresponding one of the first current and the second current.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

In order to illustrate the purposes, features and advantages of the invention, the embodiments and figures of the invention are described in detail as follows.

Figure 1:
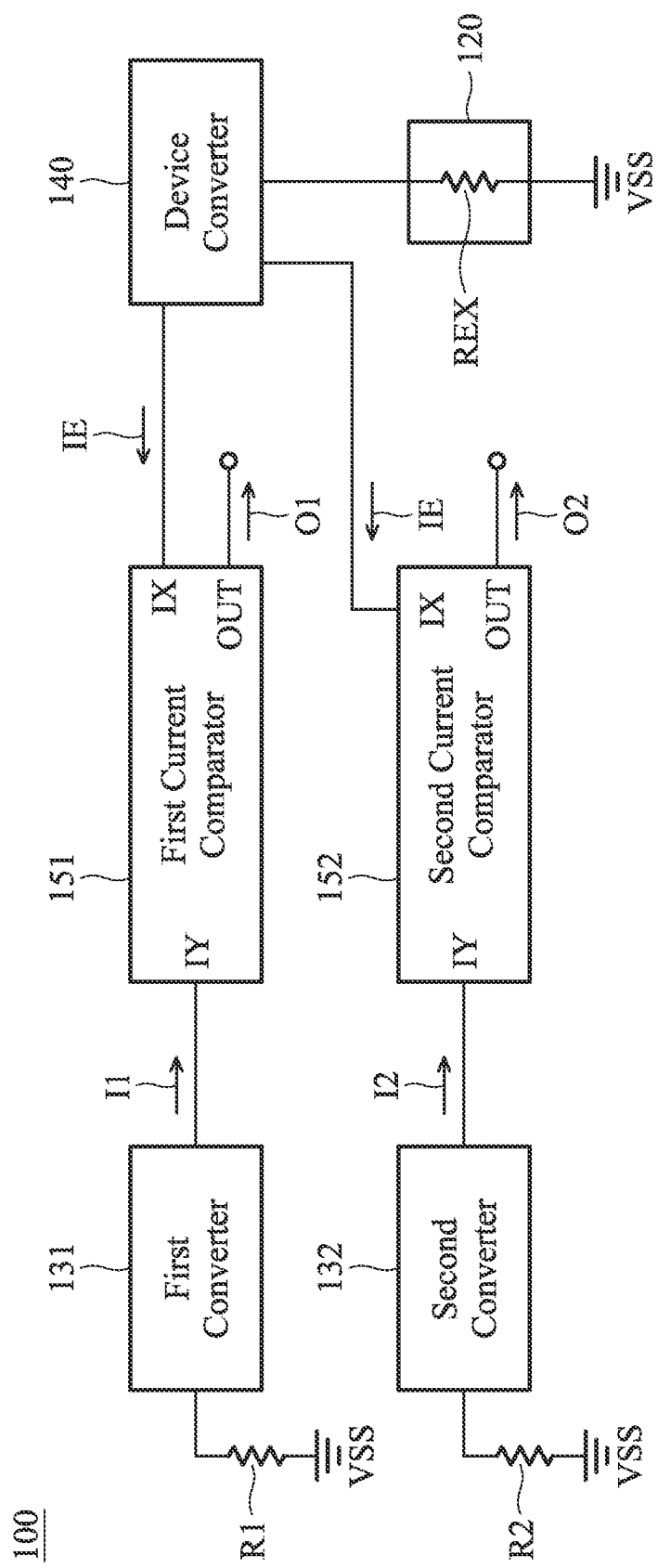
FIG. 1 is a diagram of a detection circuit according to an embodiment of the invention.

FIG. 1 is a diagram of a detection circuit 100 according to an embodiment of the invention. The detection circuit 100 may be applied in a mobile device, such as a smartphone, a tablet computer, or a notebook computer. When an external device 120 is connected to the mobile device (such as via a Micro-USB port of the mobile device), the detection circuit 100 detects the specific resistance of the external device 120 (e.g., the external device 120 may be modeled as a device resistor REX). The type of external device 120 may be determined by a processor (not shown) according to the specific resistance. In the embodiment of FIG. 1, the detection circuit 100 includes a first resistor R1, a second resistor R2, a first converter 131, a second converter 132, a device converter 140, a first current comparator 151, and a second current comparator 152. The first resistor R1 has a first resistance. The second resistor R2 has a second resistance. The second resistance may be different from the first resistance. The first converter 131 converts the first resistance into a first current I1. The second converter 132 converts the second resistance into a second current I2. The device converter 140 converts the specific resistance into a specific current IE. The first current comparator 151 compares the specific current IE with the first current I1, and generates a first output signal O1 accordingly. The second current comparator 152 compares the specific current IE with the second current I2, and generates a second output signal O2 accordingly. By reading the first output signal O1 and the second output signal O2, the processor can estimate the specific resistance of the external device 120, so as to obtain the type and information of the external device 120.

Figure 2:
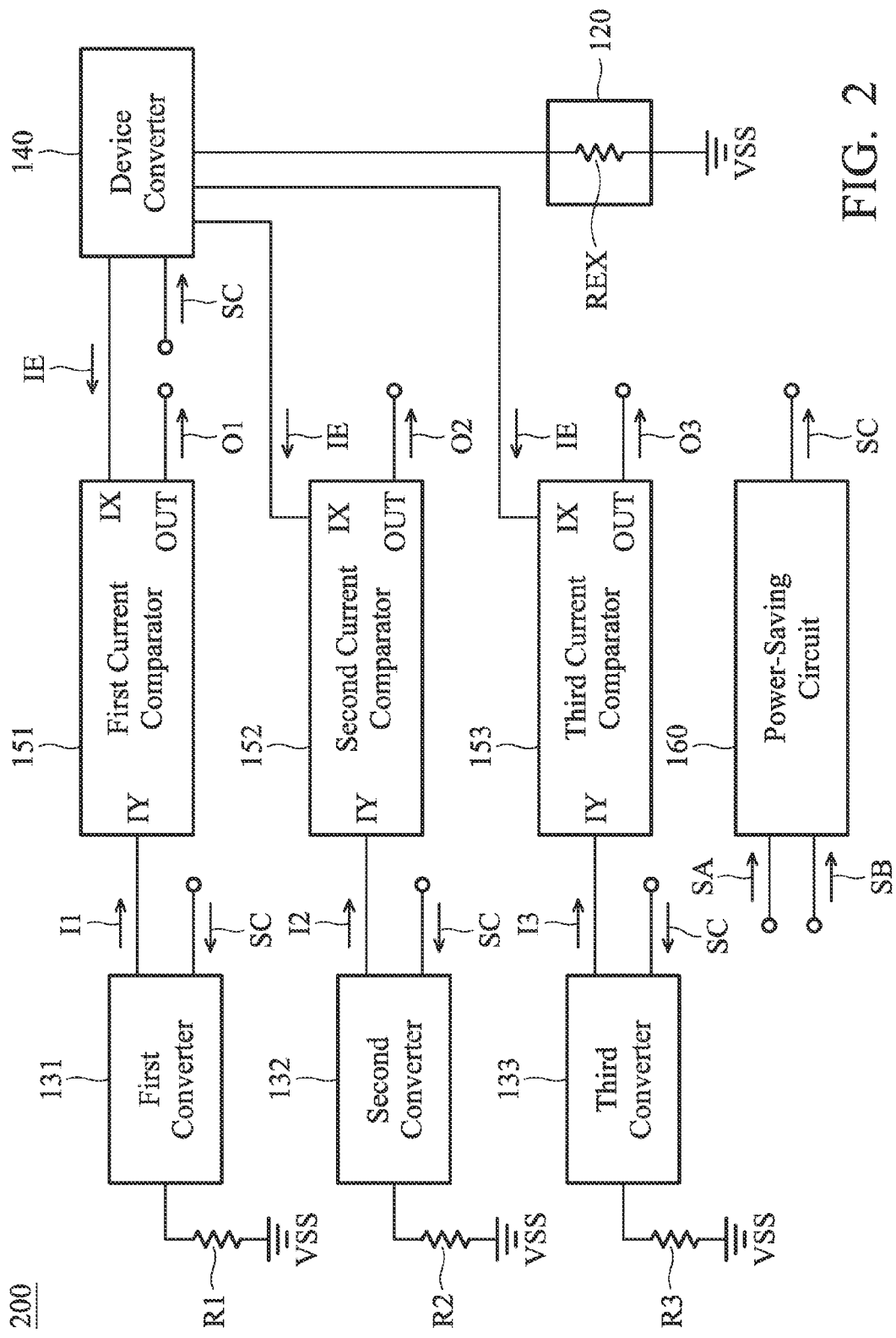
FIG. 2 is a diagram of a detection circuit according to an embodiment of the invention.

FIG. 2 is a diagram of a detection circuit 200 according to an embodiment of the invention. FIG. 2 is similar to FIG. 1. The difference between the two embodiments is that the detection circuit 200 further includes a third resistor R3, a third converter 133, a third current comparator 153, and a power-saving circuit 160. The third resistor R3 has a third resistance. The third resistance may be different from the first resistance and the second resistance. The third converter 133 converts the third resistance into a third current I3. The third current comparator 153 compares the specific current IE with the third current I3, and generates a third output signal O3 accordingly. The first output signal O1, the second output signal O2, and the third output signal O3 are used by the processor to determine the specific resistance and the type of external device 120. It should be understood the number of resistors, converters, or current comparators is not limited in the invention. In other embodiments, the detection circuit 200 may include more than three resistors, more than three converters, and more than three current comparators, so as to estimate the specific resistance of the external device 120 more accurately.

Figure 3:
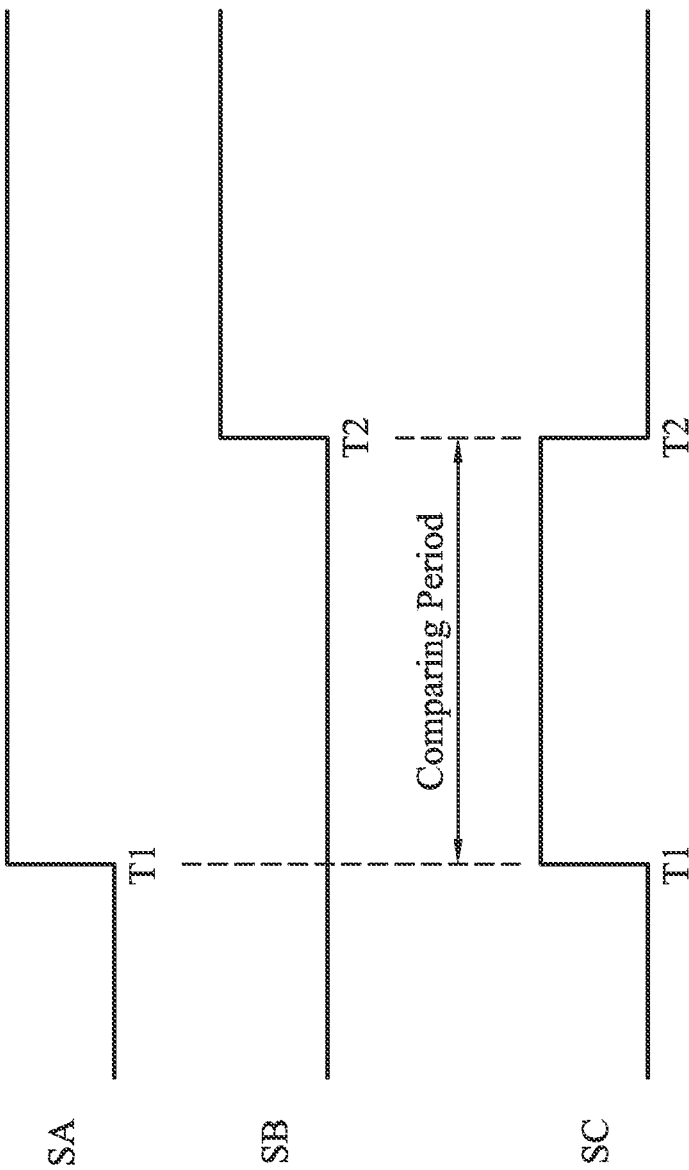
FIG. 3 is a diagram of signal waveforms according to an embodiment of the invention.

The power-saving circuit 160 generates a control signal SC for selectively enabling and disabling the device converter 140, the first converter 131, the second converter 132, and the third converter 133. The control signal SC may be generated according to a start signal SA and a stop signal SB from the processor. For example, the processor may output the start signal SA to request that the current comparators generate the output signals, and then it may output the stop signal SB when the output signals have been received successfully by the processor. For example, the processor may generate the start signal SA periodically (e.g., every 1 millisecond, or every 1 second) so as to timely detect whether an external device 120 is connected. FIG. 3 is a diagram of signal waveforms according to an embodiment of the invention. The horizontal axis represents time, and the vertical axis represents signal voltage level. At a first time point T1, when the start signal SA rises from a low logic level (e.g., a logic "0") to a high logic level (e.g., a logic "1"), the control signal SC rises from a low logic level to a high logic level. Then, at a second time point T2, when the stop signal SB rises from a low logic level to a high logic level, the control signal SC falls from a high logic level to a low logic level. The time period between the first time point T1 and the second time point T2 is considered a comparing period, in which the control signal SC is kept at a high logic level. The device converter 140, the first converter 131, the second converter 132, and the third converter 133 may be enabled by the power-saving circuit 160 only during the comparing period, thereby reducing the total power consumption of the detection circuit 200.

The structures of the aforementioned converters and current comparators will be described in detail in the following embodiments. It should be understood that their circuit structures are just exemplary, rather than limitations of the invention.

Figure 4:
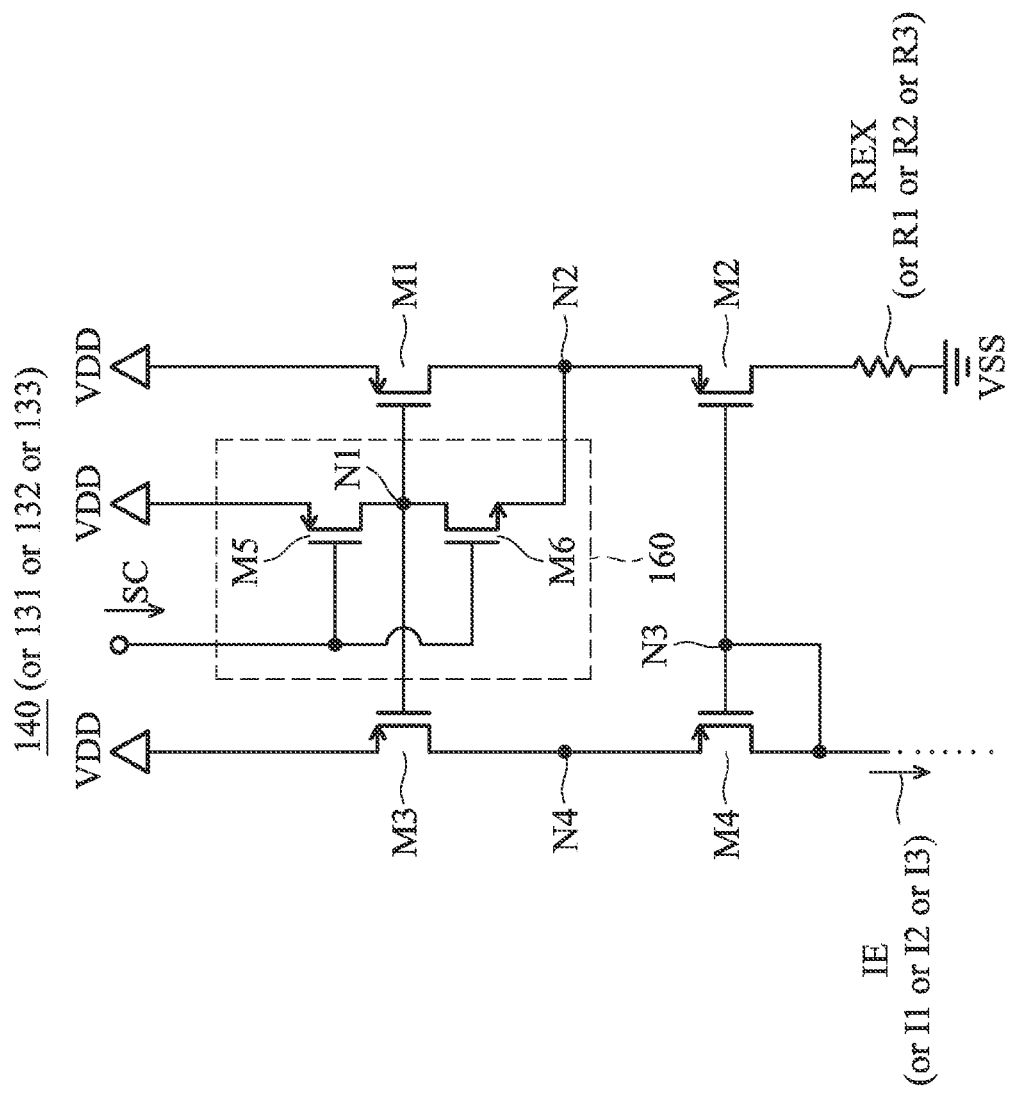
FIG. 4 is a diagram of a device converter, a first converter, a second converter, or a third converter according to an embodiment of the invention.

FIG. 4 is a diagram of the device converter 140, the first converter 131, the second converter 132, or the third converter 133 according to an embodiment of the invention. In the embodiment of FIG. 4, each of the device converter 140, the first converter 131, the second converter 132, and the third converter 133 at least includes a first transistor M1, a second transistor M2, a third transistor M3, and a fourth transistor M4. The first transistor M1, the second transistor M2, the third transistor M3, and the fourth transistor M4 may be PMOS transistors (P-type Metal Oxide Semiconductor Field Effect Transistors). The first transistor M1 has a control terminal coupled to a first node N1, a first terminal coupled to a supply voltage VDD, and a second terminal coupled to a second node N2. The second transistor M2 has a control terminal coupled to a third node N3, a first terminal coupled to the second node N2, and a second terminal coupled to a corresponding one of the external device 120, the first resistor R1, the second resistor R2, and the third resistor R3. That is, if FIG. 4 is used to describe the circuit structure of the device converter 140, the second terminal of the second transistor M2 may be coupled through the external device 120 to the a ground voltage VSS, and if FIG. 4 is used to describe the circuit structure of the first converter 131, the second terminal of the second transistor M2 may be coupled through the first resistor R1 to the ground voltage VSS, and so on. The third transistor M3 has a control terminal coupled to the first node N1, a first terminal coupled to the supply voltage VDD, and a second terminal coupled to a fourth node N4. The fourth transistor M4 has a control terminal coupled to the third node N3, a first terminal coupled to the fourth node N4, and a second terminal coupled to the third node N3. The third node N3 is arranged for outputting a corresponding one of the specific current IE, the first current I1, the second current I2, and the third current I3. That is, if FIG. 4 is used to describe the circuit structure of the device converter 140, the third node N3 may be arranged for outputting the specific current IE, and if FIG. 4 is used to describe the circuit structure of the first converter 131, the third node N3 may be arranged for outputting the first current I1, and so on. As a result, by using the device converter 140, the first converter 131, the second converter 132, and the third converter 133, the specific resistance of the external device 120, the first resistance of the first resistor R1, the second resistance of the second resistor R2, and the third resistance of the third resistor R3 can be converted into the specific current IE, the first current I1, the second current I2, and the third current I3, respectively. For every converter, if the magnitude of output current is relatively small, the relationship between the resistance and the output current may be approximately represented by the equation (1) as follows:

$$I \approx VDD - 2 \times Vt/R \quad (1)$$

where I represents a corresponding one of the specific current IE, the first current I1, the second current I2, and the third current I3, where VDD represents the supply voltage VDD, where Vt represents the threshold voltage of the first transistor M1, the second transistor M2, the third transistor M3, or the fourth transistor M4, and where R represents a corresponding one of the specific resistance, the first resistance, the second resistance, and the third resistance.

In alternative embodiments, each of the device converter 140, the first converter 131, the second converter 132, and the third converter 133 further includes a fifth transistor M5 and a sixth transistor M6, so as to form the power-saving circuit 160. The fifth transistor M5 may be a PMOS transistor, and the sixth transistor M6 may be an NMOS transistor (N-type Metal Oxide Semiconductor Field Effect Transistor). The fifth transistor M5 has a control terminal for receiving the control signal SC, a first terminal coupled to the supply voltage VDD, and a second terminal coupled to the first node N1. The sixth transistor M6 has a control terminal for receiving the control signal SC, a first terminal coupled to the second node N2, and a second terminal coupled to the first node N1. When the control signal SC has a low logic level, the voltage at the first node N1 is pulled up to a high logic level by the fifth transistor M5, such that the first transistor M1 and the third transistor M3 are both turned off. In cases like this, currents cannot flow through the first transistor M1 and the third transistor M3, and thus no current is outputted at the second terminal of the fourth transistor M4; therefore the device converter 140, the first converter 131, the second converter 132, and the third converter 133 are all disabled (i.e., a standby mode or a sleep mode). Conversely, when the control signal SC has a high logic level, the first node N1 is coupled to the second node N2, such that the first transistor M1 and the third transistor M3 form a current mirror. In cases like this, currents can flow through the first transistor M1 and the third transistor M3, and therefore the device converter 140, the first converter 131, the second converter 132, and the third converter 133 are all enabled (i.e., a normal mode or a work mode), so that the output current corresponding to the resistance at the second terminal of the second transistor M2 according to the equation (1) may be generated.

It should be understood that the device converter 140, the first converter 131, the second converter 132, and the third converter 133 do not share any elements (e.g., the first transistor M1, the second transistor M2, and so on) with each other. The same reference numerals of elements are used for readers to understand that the circuits have similar structures and partially identical elements. As a matter of fact, the elements of the device converter 140, the first converter 131, the second converter 132, and the third converter 133 are independent of each other.

Figure 5A:
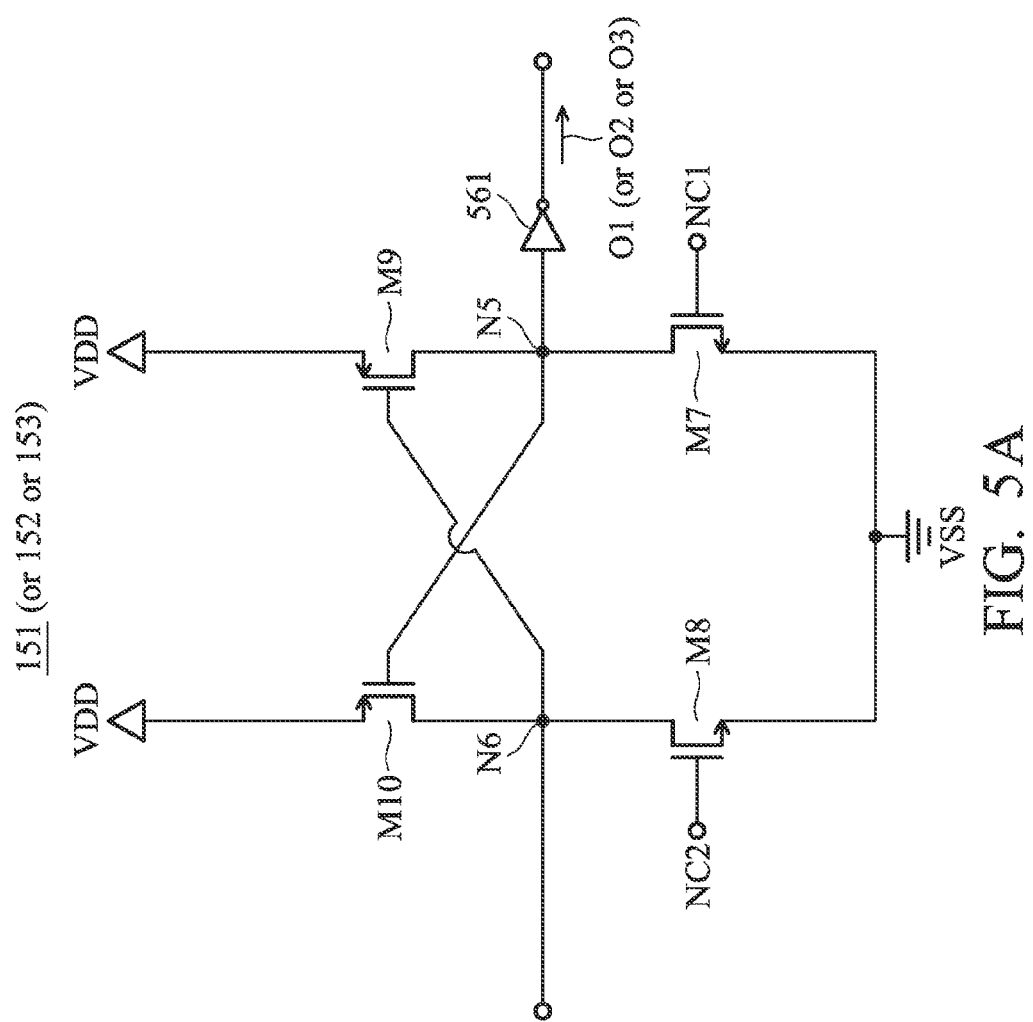
FIG. 5A is a diagram of a first current comparator, a second current comparator, or a third current comparator according to an embodiment of the invention.
Figure 5B:
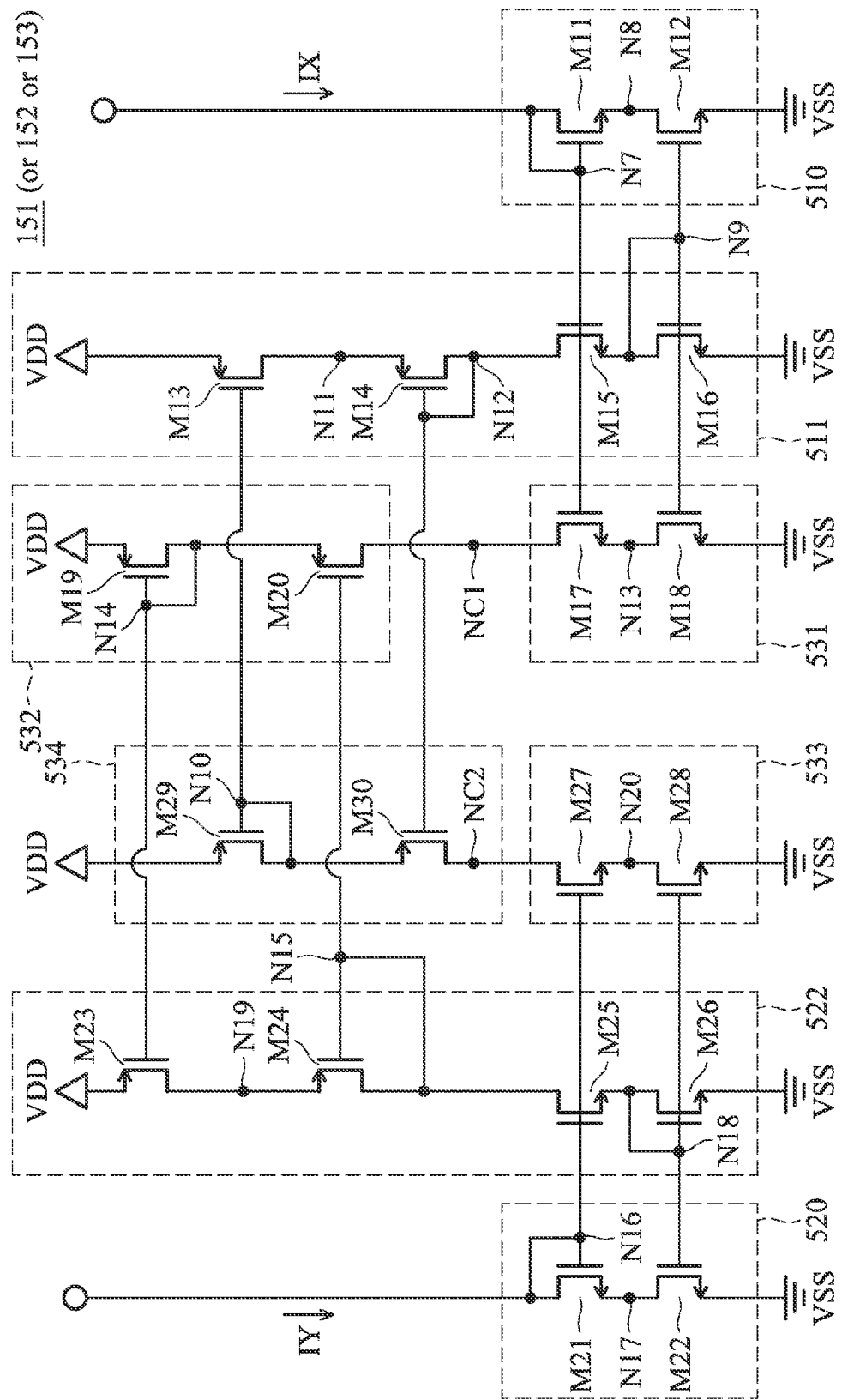
FIG. 5B is a diagram of a first current comparator, a second current comparator, or a third current comparator according to an embodiment of the invention.

FIG. 5A and FIG. 5B are a diagram of the first current comparator 151, the second current comparator 152, or the third current comparator 153 according to an embodiment of the invention. Please refer to FIG. 5A and FIG. 5B together. They show two connected portions of the first current comparator 151, the second current comparator 152, or the third current comparator 153. In the embodiment of FIG. 5A and FIG. 5B, each of the first current comparator 151, the second current comparator 152, and the third current comparator 153 includes a first input branch 510, a second input branch 520, a first sink-to-source branch 511, a second sink-to-source branch 522, a first comparing branch 531, a second comparing branch 532, a third comparing branch 533, and a fourth comparing branch 534. The first input branch 510 receives a first input current IX. The first input current IX may be the specific current IE. The second input branch 520 receives a second input current IY. The second input current IY may be a corresponding one of the first current I1, the second current I2, and the third current I3. That is, if FIG. 5B is used to describe the circuit structure of the first current comparator 151, the second input current IY may be the first current I1, and if FIG. 5B is used to describe the circuit structure of the second current comparator 152, the second input current IY may be the second current I2, and so on. The first input branch 510 is coupled through the first sink-to-source branch 511 to the first comparing branch 531 and the second comparing branch 532. A first control node NC1 is coupled between the first comparing branch 531 and the second comparing branch 532. The second input branch 520 is coupled through the second sink-to-source branch 522 to the third comparing branch 533 and the fourth comparing branch 534. A second control node NC2 is coupled between the third comparing branch 533 and the fourth comparing branch 534. Each of the first current comparator 151, the second current comparator 152, and the third current comparator 153 is configured to compare its first input current IX with its second input current IY, and generate a corresponding one of the first output signal O1, the second output signal O2, and the third output signal O3. For example, if the first input current IX is greater than the second input current IY, the corresponding output signal O1, O2, or O3 may have a low logic level, and if the first input current IX is smaller than the second input current IY, the corresponding output signal O1, O2, or O3 may have a high logic level.

In some embodiments, each of the first current comparator 151, the second current comparator 152, and the third current comparator 153 further includes a seventh transistor M7, an eighth transistor M8, a ninth transistor M9, a tenth transistor M10, and a first inverter 561. The seventh transistor M7 and the eighth transistor M8 may be NMOS transistors, and the ninth transistor M9 and the tenth transistor M10 may be PMOS transistors. The seventh transistor M7 has a control terminal coupled to the first control node NC1, a first terminal coupled to the ground voltage VSS, and a second terminal coupled to a fifth node N5. The eighth transistor M8 has a control terminal coupled to the second control node NC2, a first terminal coupled to the ground voltage VSS, and a second terminal coupled to a sixth node N6. The ninth transistor M9 has a control terminal coupled to the sixth node N6, a first terminal coupled to the supply voltage VDD, and a second terminal coupled to the fifth node N5. The tenth transistor M10 has a control terminal coupled to the fifth node N5, a first terminal coupled to the supply voltage VDD, and a second terminal coupled to the sixth node N6. The first inverter 561 has an input terminal coupled to the fifth node N5, and an output terminal. In one embodiment, the output terminal of the first inverter 561 is arranged for outputting a corresponding one of the first output signal O1, the second output signal O2, and the third output signal O3, where the first inverter 561 may also serve as an output buffer for outputting a corresponding one of the first output signal O1, the second output signal O2, and the third output signal O3 to the processor. That is, if FIG. 5A is used to describe the circuit structure of the first current comparator 151, the output terminal of the first inverter 561 may be arranged for outputting the first output signal O1, and if FIG. 5A is used to describe the circuit structure of the second current comparator 152, the output terminal of the first inverter 561 may be arranged for outputting the second output signal O2, and so on. In another embodiment, the sixth node N6 is arranged for outputting a corresponding one of the first output signal O1, the second output signal O2, and the third output signal O3, where the first inverter 561 may be omitted.

In some embodiments, the first input branch 510 includes an eleventh transistor M11 and a twelfth transistor M12. The eleventh transistor M11 and the twelfth transistor M12 may be NMOS transistors. The eleventh transistor M11 has a control terminal coupled to a seventh node N7, a first terminal coupled to an eighth node N8, and a second terminal coupled to the seventh node N7. The twelfth transistor M12 has a control terminal coupled to a ninth node N9, a first terminal coupled to the ground voltage VSS, and a second terminal coupled to the eighth node N8. The seventh node N7 is arranged for receiving the first input current IX, such as the specific current IE. The first input branch 510 serves to mirror the first input current IX to the first sink-to-source branch 511.

In some embodiments, the first sink-to-source branch 511 includes a thirteenth transistor M13, a fourteenth transistor M14, a fifteenth transistor M15, and a sixteenth transistor M16. The thirteenth transistor M13 and the fourteenth transistor M14 may be PMOS transistors, and the fifteenth transistor M15 and the sixteenth transistor M16 may be NMOS transistors. The thirteenth transistor M13 has a control terminal coupled to a tenth node N10, a first terminal coupled to the supply voltage VDD, and a second terminal coupled to an eleventh node N11. The fourteenth transistor M14 has a control terminal coupled to a twelfth node N12, a first terminal coupled to the eleventh node N11, and a second terminal coupled to the twelfth node N12. The fifteenth transistor M15 has a control terminal coupled to the seventh node N7, a first terminal coupled to the ninth node N9, and a second terminal coupled to the twelfth node N12. The sixteenth transistor M16 has a control terminal coupled to the ninth node N9, a first terminal coupled to the ground voltage VSS, and a second terminal coupled to the ninth node N9. The first sink-to-source branch 511 serves to mirror the sinking current from the first input branch 510 to the first comparing branch 531 with sinking current and the fourth comparing branch 534 with sourcing current.

In some embodiments, the second input branch 520 includes a twenty-first transistor M21 and a twenty-second transistor M22. The twenty-first transistor M21 and the twenty-second transistor M22 may be NMOS transistors. The twenty-first transistor M21 has a control terminal coupled to a sixteenth node N16, a first terminal coupled to a seventeenth node N17, and a second terminal coupled to the sixteenth node N16. The twenty-second transistor M22 has a control terminal coupled to an eighteenth node N18, a first terminal coupled to the ground voltage VSS, and a second terminal coupled to the seventeenth node N17. The sixteenth node N16 is arranged for receiving the second input current IY, such as a corresponding one of the first current I1, the second current I2, and the third current I3. The second input branch 520 serves to mirror the second input current IY to the second sink-to-source branch 522.

In some embodiments, the second sink-to-source branch 522 includes a twenty-third transistor M23, a twenty-fourth transistor M24, a twenty-fifth transistor M25, and a twenty-sixth transistor M26. The twenty-third transistor M23 and the twenty-fourth transistor M24 may be PMOS transistors, and the twenty-fifth transistor M25 and the twenty-sixth transistor M26 may be NMOS transistors. The twenty-third transistor M23 has a control terminal coupled to the fourteenth node N14, a first terminal coupled to the supply voltage VDD, and a second terminal coupled to a nineteenth node N19. The twenty-fourth transistor M24 has a control terminal coupled to the fifteenth node N15, a first terminal coupled to the nineteenth node N19, and a second terminal coupled to the fifteenth node N15. The twenty-fifth transistor M25 has a control terminal coupled to the sixteenth node N16, a first terminal coupled to the eighteenth node N18, and a second terminal coupled to the fifteenth node N15. The twenty-sixth transistor M26 has a control terminal coupled to the eighteenth node N18, a first terminal coupled to the ground voltage VSS, and a second terminal coupled to the eighteenth node N18. The second sink-to-source branch 522 serves to mirror the sinking current from the second input branch 520 to the third comparing branch 533 with sinking current and the second comparing branch 532 with sourcing current.

In some embodiments, the first comparing branch 531 includes a seventh transistor M17 and an eighth transistor M18. The seventh transistor M17 and the eighth transistor M18 are NMOS transistors. The seventeenth transistor M17 has a control terminal coupled to the seventh node N7, a first terminal coupled to a thirteenth node N13, and a second terminal coupled to the first control node NC1. The eighteenth transistor M18 has a control terminal coupled to the ninth node N9, a first terminal coupled to the ground voltage VSS, and a second terminal coupled to the thirteenth node N13. The first comparing branch 531 serves to conduct a sinking current mirrored from the first input current IX, such as the specific current IE.

In some embodiments, the second comparing branch 532 includes a nineteenth transistor M19 and a twentieth transistor M20. The nineteenth transistor M19 and the twentieth transistor M20 are PMOS transistors. The nineteenth transistor M19 has a control terminal coupled to a fourteenth node N14, a first terminal coupled to the supply voltage VDD, and a second terminal coupled to the fourteenth node N14. The twentieth transistor M20 has a control terminal coupled to a fifteenth node N15, a first terminal coupled to the fourteenth node N14, and a second terminal coupled to the first control node NC1. The second comparing branch 532 serves to conduct a sourcing current mirrored from the second input current IY, such as a corresponding one of the first current I1, the second current I2, and the third current I3.

In some embodiments, the third comparing branch 533 includes a twenty-seventh transistor M27 and a twenty-eighth transistor M28. The twenty-seventh transistor M27 and the twenty-eighth transistor M28 may be NMOS transistors. The twenty-seventh transistor M27 has a control terminal coupled to the sixteenth node N16, a first terminal coupled to a twentieth node N20, and a second terminal coupled to the second control node NC2. The twenty-eighth transistor M28 has a control terminal coupled to the eighteenth node N18, a first terminal coupled to the ground voltage VSS, and a second terminal coupled to the twentieth node N20. The third comparing branch 533 serves to conduct a sinking current mirrored from the second input current IY, such as a corresponding one of the first current I1, the second current I2, and the third current I3.

In some embodiments, the fourth comparing branch 534 includes a twenty-ninth transistor M29 and a thirtieth transistor M30. The twenty-ninth transistor M29 and the thirtieth transistor M30 may be PMOS transistors. The twenty-ninth transistor M29 has a control terminal coupled to the tenth node N10, a first terminal coupled to the supply voltage VDD, and a second terminal coupled to the tenth node N10. The thirtieth transistor M30 has a control terminal coupled to the twelfth node N12, a first terminal coupled to the tenth node N10, and a second terminal coupled to the second control node NC2. The fourth comparing branch 534 serves to conduct a sourcing current mirrored from the first input current IX, such as the specific current IE. As may be seen from FIGS. 5A and 5B, when the first input current IX is larger than the second input current IY, the first control node NC1 will tend to draw a net current from the control terminal of the seventh transistor M7, and the second control node NC2 will tend to output a net current to the control terminal of the eighth transistor M8. Since the resistance at the control terminals of transistors are nearly infinitively large, the voltage at the control terminal of the seventh transistor M7 will rapidly decrease and the voltage at the control terminal of the eighth transistor M8 will rapidly increase, so that the fifth node N5 has a high logic level and the output terminal of the first inverter 561 (i.e., a corresponding one of the first output signal O1, the second output signal O2, and the third output signal O3) has a low voltage level.

It should be understood that the first current comparator 151, the second current comparator 152, and the third current comparator 153 do not share any elements (e.g., the eleventh transistor M11, the twelfth transistor M12, and so on) with each other. The same reference numerals of elements are used for readers to understand that the circuits have similar structures and partially identical elements. As a matter of fact, the elements of the first current comparator 151, the second current comparator 152, and the third current comparator 153 are independent of each other. It should also be understood that although two cascaded transistors are used in each of the first input branch 510, the second input branch 520, the first sink-to-source branch 511, the second sink-to-source branch 522, the first comparing branch 531, the second comparing branch 532, the third comparing branch 533, and the fourth comparing branch 534 in the above embodiments, there may be any number of transistors in each of the above branches. It should also be understood that although the device converter 140 (first converter 131/second converter 132/third converter 133) in FIG. 4 is implemented as a current source for the specific current IE (first current I1/second current I2/third current I3), in other embodiments, it may also be implemented as a current sink with the configurations of the circuits in FIG. 4, FIG. 5A, and FIG. 5B being correspondingly changed (i.e., by switching the polarity of voltage sources and the type of transistors). It should also be understood that although the currents flowing in the first sink-to-source branch 511, the first comparing branch 531, and the fourth comparing branch 534 are the same as the first input current IX, and the currents flowing in the second sink-to-source branch 522, the second comparing branch 532, and the third comparing branch 533 are the same as the second input current IY, in other embodiments, the currents flowing in the first sink-to-source branch 511, the first comparing branch 531, and the fourth comparing branch 534 may differ from the first input current IX by a proportion determined by the aspect ratios of the transistors used therein, and the currents flowing in the second sink-to-source branch 522, the second comparing branch 532, and the third comparing branch 533 may differ from the second input current IY by the same proportion similarly determined by the aspect ratios of the transistors used therein.

The specific resistance of the external device 120 is estimated by the processor according to the output signals from the current comparators. For example, it is assumed that the first resistance of the first resistor R1 is 5 k$\Omega$, the second resistance of the second resistor R2 is 1 k$\Omega$, and the third resistance of the third resistor R3 is 200$\Omega$. With such a design, the relationship between the specific resistance and the output signals may be set as the following Table I:

TABLE I

Relationship between Specific Resistance and Output Signals

| Specific resistance | First output signal O1 | Second output signal O2 | Third output signal O3 |
|---|---|---|---|
| 8 k$\Omega$ | 1 | 1 | 1 |
| 2 k$\Omega$ | 0 | 1 | 1 |
| 500$\Omega$ | 0 | 0 | 1 |
| 50$\Omega$ | 0 | 0 | 0 |

After detecting the range of the specific resistance, the processor can further determine the type of external device 120 accordingly. For example, if it is detected that the specific resistance is about 8 k$\Omega$, the processor may determine that the external device 120 is a large-size display device, and if it is detected that the specific resistance is about 500$\Omega$, the processor may determine that the external device 120 is a small watch, and so on.

Figure 6:
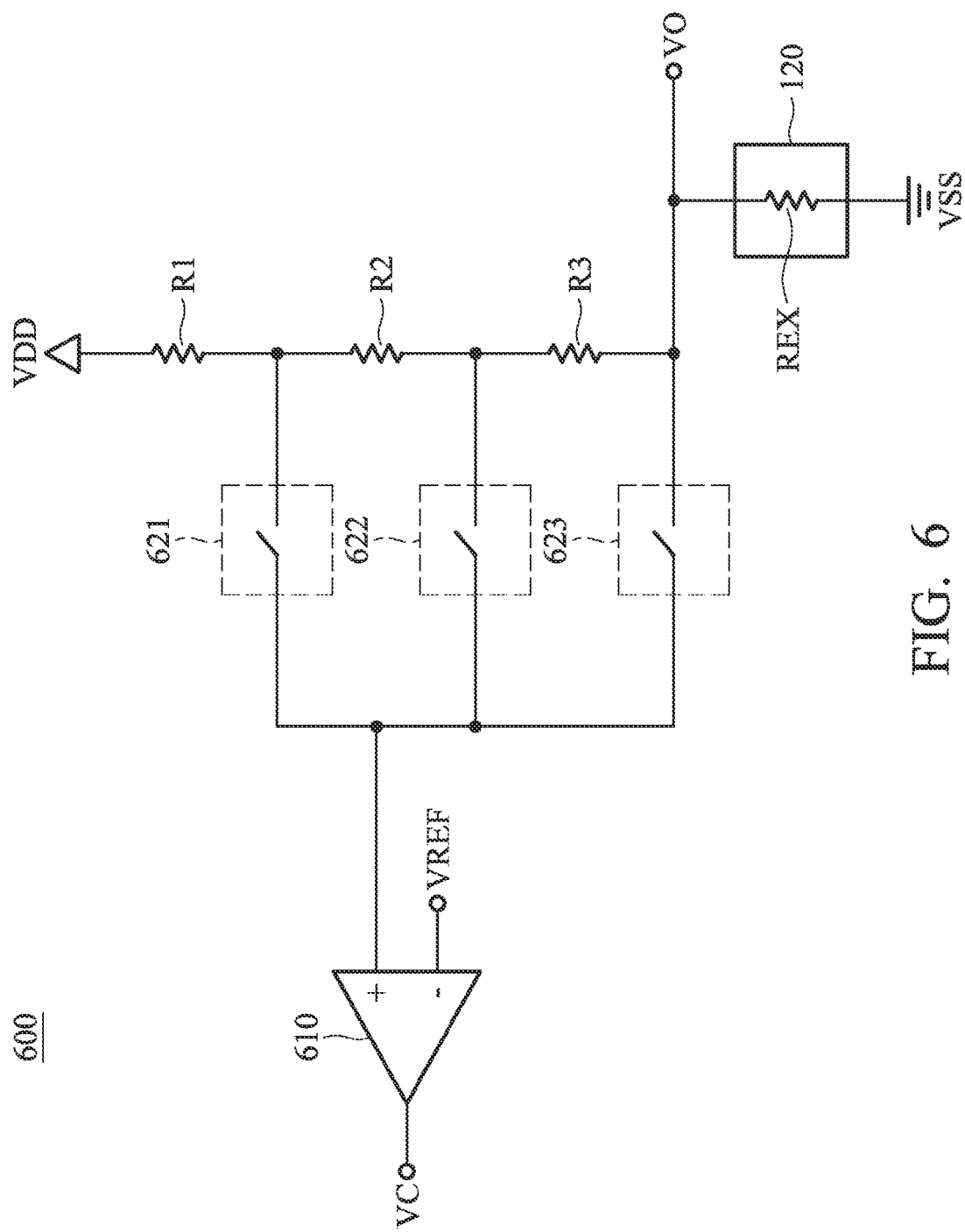
FIG. 6 is a diagram of a detection circuit according to another embodiment of the invention.

FIG. 6 is a diagram of a detection circuit 600 according to another embodiment of the invention. In the embodiment of FIG. 6, the detection circuit 600 includes a voltage comparator 610, a first switch 621, a second switch 622, a third switch 623, a first resistor R1, a second resistor R2, and a third resistor R3. When an external device 120 is connected to a mobile device including the detection circuit 600, the detection circuit 600 detects a specific resistance of the external device 120 (e.g., the external device 120 may be modeled as a device resistor REX). The detection procedure of the detection circuit 600 may include the steps of turning on the first switch 621, the second switch 622, and the third switch 623 one after another, and sequentially recording the corresponding output signal VC from the voltage comparator 610. The voltage at a positive input of the voltage comparator 610 is determined by the supply voltage VDD and a voltage divider formed by the first resistor R1, the second resistor R2, the third resistor R3, and the device resistor REX depending on which of the first switch 621, the second switch 622, and the third switch 623 is turned on; the voltage at the positive input of the voltage comparator 610 is compared with a reference voltage VREF at a negative input of the voltage comparator 610 to generate the corresponding output signal VC. In one embodiment, the first resistor R1, the second resistor R2, and the third resistor R3 may have resistances of 5 k$\Omega$, 1 k$\Omega$, and 200$\Omega$, respectively, to detect the specific resistances listed in Table I in above. Every time the output signal VC is recorded, it may be considered as one of the respective output signals O1, O2, and O3 above. Furthermore, the type of external device 120 may be determined by a processor (not shown) according to each output signal VC.

The invention provides a novel design of detection circuit. In conclusion, the proposed detection circuit has at least the following advantages, compared with the prior art: (1) replacing conventional voltage comparators with current comparators; (2) omitting the use of conventional transistor switches; (3) reducing the transistor size and total area of the detection circuit; (4) outputting all signals which represent the specific resistance of the external device within one cycle; and (5) shortening the total time period for detection.

Note that the above signal voltages, currents, resistances, and other element parameters are not limitations of the invention. A designer can adjust these parameters according to different requirements. The detection circuit of the invention is not limited to the configurations of FIGS. 1-6. The invention may merely include any one or more features of any one or more embodiments of FIGS. 1-6. In other words, not all of the features displayed in the figures should be implemented in the detection circuit of the invention.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

It will be apparent to those skilled in the art that various modifications and variations can be made in the invention. It is intended that the standard and examples be considered exemplary only, with a true scope of the disclosed embodiments being indicated by the following claims and their equivalents.

What is claimed is:

1. A detection circuit for detecting an external device with a specific resistance, comprising:
   a first resistor, having a first resistance;
   a second resistor, having a second resistance;
   a first converter, converting the first resistance into a first current;
   a second converter, converting the second resistance into a second current;
   a device converter, converting the specific resistance into a specific current;
   a first current comparator, comparing the specific current with the first current, and generating a first output signal; and
   a second current comparator, comparing the specific current with the second current, and generating a second output signal,
   wherein the specific resistance is determined according to the first output signal and the second output signal;
   wherein each of the device converter, the first converter, and the second converter comprises:
   a first transistor, wherein the first transistor has a control terminal, a first terminal coupled to a supply voltage, and a second terminal;
   a second transistor, wherein the second transistor has a control terminal, a first terminal coupled to the second terminal of the first transistor, and a second terminal coupled to a corresponding one of the external device, the first resistor, and the second resistor;
   a third transistor, wherein the third transistor has a control terminal coupled to the control terminal of the first transistor, a first terminal coupled to the supply voltage, and a second terminal; and
   a fourth transistor, wherein the fourth transistor has a control terminal coupled to the control terminal of the second transistor, a first terminal coupled to the second terminal of the third transistor, and a second terminal coupled to the control terminal for outputting a corresponding one of the specific current, the first current, and the second current.

2. The detection circuit as claimed in claim 1, further comprising:
   a power-saving circuit, generating a control signal for selectively enabling and disabling the device converter, the first converter, and the second converter.

3. The detection circuit as claimed in claim 2, wherein the device converter, the first converter, and the second converter are enabled periodically and disabled after the first output signal and the second output signal are generated.

4. The detection circuit as claimed in claim 2, wherein each of the device converter, the first converter, and the second converter further comprises:
   a fifth transistor, wherein the fifth transistor has a control terminal for receiving the control signal, a first terminal coupled to the supply voltage, and a second terminal coupled to the control terminal of the first transistor; and
   a sixth transistor, wherein the sixth transistor has a control terminal for receiving the control signal, a first terminal coupled to the second terminal of the first transistor, and a second terminal coupled to the control terminal of the first transistor.

5. The detection circuit as claimed in claim 1, wherein each of the first current comparator and the second current comparator comprises:
   a seventh transistor, wherein the seventh transistor has a control terminal, a first terminal coupled to a ground voltage, and a second terminal;
   an eighth transistor, wherein the eighth transistor has a control terminal, a first terminal coupled to the ground voltage, and a second terminal;
   a ninth transistor, wherein the ninth transistor has a control terminal coupled to the second terminal of the eighth transistor, a first terminal coupled to a supply voltage, and a second terminal coupled to the second terminal of the seventh transistor;
   a tenth transistor, wherein the tenth transistor has a control terminal coupled to the second terminal of the seventh transistor, a first terminal coupled to the supply voltage, and a second terminal coupled to the second terminal of the eighth transistor;
   a first inverter, wherein the first inverter has an input terminal coupled to the second terminal of the seventh transistor, and an output terminal;
   a first comparing branch, coupled between the ground voltage and the control terminal of the seventh transistor, and conducting a current mirrored from the specific current;
   a second comparing branch, coupled between the supply voltage and the control terminal of the seventh transistor, and conducting a current mirrored from a corresponding one of the first current and the second current;
   a third comparing branch, coupled between the ground voltage and the control terminal of the eighth transistor, and conducting a current mirrored from a corresponding one of the first current and the second current; and
   a fourth comparing branch, coupled between the supply voltage and the control terminal of the eighth transistor, and conducting a current mirrored from the specific current,
   wherein the output terminal of the first inverter outputs a corresponding one of the first output signal and the second output signal.

6. The detection circuit as claimed in claim 5, wherein each of the first current comparator and the second current comparator further comprises:
   a first sink-to-source branch, coupled between the supply voltage and the ground voltage, and mirroring the specific current to the first comparing branch and the fourth comparing branch; and
   a second sink-to-source branch, coupled between the supply voltage and the ground voltage, and mirroring a corresponding one of the first current and the second current to the second comparing branch and the third comparing branch.

7. The detection circuit as claimed in claim 6, wherein each of the first current comparator and the second current comparator further comprises:
   a first input branch, receiving the specific current and mirroring the specific current to the first sink-to-source branch; and
   a second input branch, receiving a corresponding one of the first current and the second current and mirroring a corresponding one of the first current and the second current to the second sink-to-source branch.

8. The detection circuit as claimed in claim 7, wherein the first comparing branch comprises:
a seventeenth transistor, wherein the seventeenth transistor has a control terminal, a first terminal, and a second terminal coupled to the control terminal of the seventh transistor; and
an eighteenth transistor, wherein the eighteenth transistor has a control terminal, a first terminal coupled to the ground voltage, and a second terminal coupled to the first terminal of the seventeenth transistor,
and wherein the fourth comparing branch comprises:
a twenty-ninth transistor, wherein the twenty-ninth transistor has a control terminal, a first terminal coupled to the supply voltage, and a second terminal coupled to the control terminal; and
a thirtieth transistor, wherein the thirtieth transistor has a control terminal, a first terminal coupled to the control terminal of the twenty-ninth transistor, and a second terminal coupled to the control terminal of the eighth transistor.

9. The detection circuit as claimed in claim 8, wherein the first sink-to-source branch comprises:
a thirteenth transistor, wherein the thirteenth transistor has a control terminal coupled to the control terminal of the twenty-ninth transistor, a first terminal coupled to the supply voltage, and a second terminal;
a fourteenth transistor, wherein the fourteenth transistor has a control terminal coupled to the control terminal of the thirtieth transistor, a first terminal coupled to the second terminal of the thirteenth transistor, and a second terminal coupled to the control terminal of the thirtieth transistor;
a fifteenth transistor, wherein the fifteenth transistor has a control terminal coupled to the control terminal of the seventeenth transistor, a first terminal, and a second terminal coupled to the control terminal of the thirtieth transistor; and
a sixteenth transistor, wherein the sixteenth transistor has a control terminal coupled to the control terminal of the eighteenth transistor, a first terminal coupled to the ground voltage, and a second terminal coupled to the control terminal.

10. The detection circuit as claimed in claim 9, wherein the first input branch comprises:
an eleventh transistor, wherein the eleventh transistor has a control terminal coupled to the control terminal of the fifteenth transistor, a first terminal, and a second terminal coupled to the control terminal; and
a twelfth transistor, wherein the twelfth transistor has a control terminal coupled to the control terminal of the sixteenth transistor, a first terminal coupled to the ground voltage, and a second terminal coupled to the first terminal of the eleventh transistor,
wherein the second terminal of the eleventh transistor receives the specific current.

11. The detection circuit as claimed in claim 7, wherein the second comparing branch comprises:

a nineteenth transistor, wherein the nineteenth transistor has a control terminal, a first terminal coupled to the supply voltage, and a second terminal coupled to the control terminal; and
a twentieth transistor, wherein the twentieth transistor has a control terminal, a first terminal coupled to the second terminal of the nineteenth transistor, and a second terminal coupled to the control terminal of the seventh transistor,
and wherein the third comparing branch comprises:
a twenty-seventh transistor, wherein the twenty-seventh transistor has a control terminal, a first terminal, and a second terminal coupled to the control terminal of the eighth transistor; and
an twenty-eighth transistor, wherein the twenty-eighth transistor has a control terminal, a first terminal coupled to the ground voltage, and a second terminal coupled to the first terminal of the twenty-seventh transistor.

12. The detection circuit as claimed in claim 11, wherein the second sink-to-source branch comprises:
a twenty-third transistor, wherein the twenty-third transistor has a control terminal coupled to the control terminal of the nineteenth transistor, a first terminal coupled to the supply voltage, and a second terminal;
a twenty-fourth transistor, wherein the twenty-fourth transistor has a control terminal coupled to the control terminal of the twentieth transistor, a first terminal coupled to the second terminal of the twenty-third transistor, and a second terminal coupled to the control terminal;
a twenty-fifth transistor, wherein the twenty-fifth transistor has a control terminal coupled to the control terminal of the twenty-seventh transistor, a first terminal, and a second terminal coupled to the second terminal of the twenty-fourth transistor; and
a twenty-sixth transistor, wherein the twenty-sixth transistor has a control terminal coupled to the control terminal of the twenty-eighth transistor, a first terminal coupled to the ground voltage, and a second terminal coupled to the control terminal.

13. The detection circuit as claimed in claim 12, wherein the second input branch comprises:
a twenty-first transistor, wherein the twenty-first transistor has a control terminal coupled to the control terminal of the twenty-fifth transistor, a first terminal, and a second terminal coupled to the control terminal; and
a twenty-second transistor, wherein the twenty-second transistor has a control terminal coupled to the control terminal of the twenty-sixth transistor, a first terminal coupled to the ground voltage, and a second terminal coupled to the first terminal of the twenty-first transistor,
wherein the second terminal of the twenty-first transistor receives a corresponding one of the first current and the second current.

* * * * *